United States Patent [19]

Oh et al.

[11] Patent Number: 5,504,373
[45] Date of Patent: Apr. 2, 1996

[54] SEMICONDUCTOR MEMORY MODULE

[75] Inventors: Sang E. Oh; Seung K. Mok, both of Seoul; Gu S. Kim; Seung H. Ahn, both of Suwon, all of Rep. of Korea

[73] Assignee: Samsung Electronics Co., Ltd., Suwon, Rep. of Korea

[21] Appl. No.: 243,644

[22] Filed: May 16, 1994

[30] Foreign Application Priority Data

May 14, 1993 [KR] Rep. of Korea ................. 93-8256

[51] Int. Cl.$^6$ ................. H01L 21/60; H05G 1/18
[52] U.S. Cl. ............ 257/734; 361/764; 361/767; 361/768; 361/777; 361/783; 257/690; 257/784; 257/786; 365/63
[58] Field of Search ................. 361/395, 403, 361/764, 767, 678, 777, 783; 365/103, 63; 257/690, 784, 786

[56] References Cited

U.S. PATENT DOCUMENTS

| | | | |
|---|---|---|---|
| 3,753,235 | 7/1973 | Daughton et al. | |
| 3,777,221 | 12/1973 | Tatusko et al. | 29/626 |
| 4,458,297 | 7/1984 | Stopper et al. | 361/403 |
| 4,656,605 | 4/1987 | Clayton. | |
| 4,795,895 | 1/1989 | Hara et al. | 235/492 |
| 4,847,732 | 7/1989 | Stopper et al. | 361/395 |

FOREIGN PATENT DOCUMENTS

| | | |
|---|---|---|
| 58-114444 | 7/1983 | Japan. |
| 63-93125 | 4/1988 | Japan. |
| 4-307943 | 10/1992 | Japan. |

*Primary Examiner*—Viet Q. Nguyen
*Attorney, Agent, or Firm*—Cushman Darby & Cushman

[57] ABSTRACT

A semiconductor memory module is formed of semiconductor packages respectively having at least one defect data line combined to be mounted to a module substrate which has two rows of auxiliary pads for excluding the defect data line of the mounted semiconductor packages from overall data lines of the module to thus attain more than a required memory capacity. By connecting the auxiliary pads with coupling units of resistors or jumper cables to isolate the defect data lines, the semiconductor memory module achieves the required memory capacity and utilizes defective semiconductor packages to reduce manufacturing costs, to attain excellent compatibility resulting from employing all kinds of semiconductor packages, and to simplify the data line connection process. Further, reworking semiconductor package is easy which improves yield, and humid air is prevented from permeating into the interior of the molding resin thereby preventing failures such as disconnection of wires and improving reliability.

5 Claims, 4 Drawing Sheets

SEMICONDUCTOR MEMORY MODULE

BACKGROUND OF THE INVENTION

1. Field of the Invention

The present invention relates to a semiconductor memory module device, and more particularly to a semiconductor memory module, wherein if a defective semiconductor device having at least one defect data line among a plurality of data lines is mounted to a module substrate, auxiliary pads are used to disconnect the defective data line and to maintain memory capacity and reduce manufacturing costs.

2. Description of the Prior Art

Due to the steady increase in memory capacity along with the current trend to incorporate microprocessor technology in electrical appliances, a plurality of semiconductor devices are mounted to a module substrate to form a semiconductor memory module for use in computers as a secondary memory device.

Memory modules using a conventional memory chip can be classified by memory capacity and the existence or the non-existence of error check and correction (hereinafter referred to as "ECC"). According to the existence or the non-existence of ECC, the memory module is classified as a binary 8 module (hereinafter referred to as "x8") provided with only an 8bit data transmission line, and a binary 9 module (hereinafter referred to as "x9") provided with an ECC memory and the 8bit data transmission line. According to memory capacity, the memory module is classified as 1Mbx8(9), 4Mbx8(9), 16Mbx8(9), etc.

Generally, the memory module formation method is widely used in semiconductor devices, and the 1Mx8(9) module having a simple structure will be taken as an example to assist the understanding of the memory module formation method.

FIG. 1 is a block diagram showing one circuit arrangement of a 1Mbx9. As shown in FIG. 1, the semiconductor device comprises two 4Mb semiconductor chips 12 and one 1Mb semiconductor chip 14.

The 4Mb semiconductor chips 12 are connected to data lines D0–D7 at their output pins, and have input pins connected to a signal input line of a column address strobe (hereinafter designated as "/CAS") signal which becomes a refresh signal of a column address for operating the semiconductor chip and an input line of a row address strobe (hereinafter designated as "/RAS") signal which will be a row address refresh signal, respectively.

The 1Mb semiconductor chip 14 has an input pin connected to an input line of a CAS for parity (hereinafter designated as "/PCAS") signal for ECC. The 4Mb semiconductor chips 12 and 1Mb semiconductor chip 14 have input pins commonly connected to a write /W signal and to an address signal AB—AB.

Although a 1Mbx9 module using nine 1Mb semiconductor packages is not illustrated, that memory module is constructed similarly to that shown by the block diagram of FIG. 1. An example of such a memory module is disclosed in U.S. Pat. No. 4,727,513, wherein nine 1Mb semiconductor packages are mounted to one side of a module substrate. Insertion pins for connecting the module with an external circuit project from one side of the module substrate and the module includes decoupling capacitors for preventing electrical shock of the semiconductor packages.

Using this technique, electrical shock to the semiconductor packages can be prevented, but a defective semiconductor package having a defective data line cannot be used.

For example, in one package among the 4Mb packages each having four data lines if a failure occurs in any one data line, during the manufacturing process of the semiconductor package, the semiconductor chip or the package itself is defective and must be discarded thereby bringing about a significant loss to a manufacturer.

A defective semiconductor chip having a faulty data line, with the failure occurring during the manufacturing process of the semiconductor package, will now be described.

FIG. 2 is a plan view showing one example of semiconductor memory module device 20 for mounting the semiconductor device of FIG. 1. and FIG. 3 is a sectional view of the semiconductor device, taken along line III—III of FIG. 2.

Semiconductor memory module 20 represents one example of a 1Mbx9 module manufactured by Meyer Hoff Co. using a chip-on-board (COB) technique. As shown in FIG. 3, semiconductor memory module 20 has grooves 24, respectively spaced by a predetermined distance on module substrate 21 having wiring patterns (not shown) on both sides thereof, and pads 25, connected to the wiring patterns around grooves 24. Separate from pads 25, auxiliary pads 26 are connected in the same way as pads 25, and 4Mb semiconductor chips 22 are mounted inside of grooves 24 by means of the COB method.

The 4Mb semiconductor chip 22 is a center-pad chip in which a bonding pad is formed in the center portion of the semiconductor chip so as to be suitable for mounting by the COB method. Here, if any one data line among the four read/write data lines has a defect, semiconductor chip 22 becomes a defective semiconductor chip with a defect data line (hereinafter referred to as "DDL").

The bonding pads of semiconductor chips 22 and pads 25 formed on predetermined portions of module substrate 21 are connected by means of wires 28, and auxiliary pad 26 corresponding to the DDL is electrically connected to the bonding pads of the semiconductor chips.

That is, because semiconductor chips 22 are center-pad chips, auxiliary pad 26 nearest to the next data line of the DDL is connected by means of wire 28, so that the 1Mbx9 module is constructed by three 4Mb semiconductor chips.

Semiconductor chips 22 and wires 28 are shielded by package body 29 molded by an epoxy molding compound (hereinafter referred to as "EMC").

As shown in FIG. 2, pins 27 inserted into an external substrate are formed on one side of module substrate 21.

The manufacturing process of semiconductor memory module 20, constructed as above, will now be described in detail.

After semiconductor chips 22 are examined to check the DDL via an inspection process, the mounting areas of respective semiconductor chips 22 are determined, and then pads 25 and auxiliary pads 26 to be connected to the bonding pads of semiconductor chips 22 are determined, respectively. At this time, the bonding pads are connected to the nearest auxiliary pads 26.

Then, semiconductor chips 22 are inserted into grooves 24 in module substrate 21 so as to be mounted using an insulation adhesive and data with respect to the locations of pads 25 or auxiliary pads 26 connected to the bonding pads is programmed in a wire bonder.

After electrically connecting the bonding pads, pads 25 and auxiliary pads 26 by wires 28, module substrate 21 is mounted in a molding die to form the package body 29 for shielding semiconductor chips 22 and wires 28.

The conventional 1Mbx9 module of the Meyer Hoff Co. is formed by using three 4Mb semiconductor chips having one DDL, so that the module having 1Mb memory capacity performing the operation of the blocks described with reference to FIG. 1 is formed to reduce manufacturing cost, by using the defective chip rather than discarding it.

However, the above-stated method is disadvantageous in that the semiconductor chip is not manufactured as a center-pad chip, and a general semiconductor chip having its bonding pads on the periphery thereof cannot be utilized.

Moreover, the DDL must be checked before mounting the defective semiconductor chips, the auxiliary pads to be used must be determined, and then the data according to the bonding position of the wire bonder must be programmed one by one. Thus, the working efficiency is lowered and the yield is degraded.

Once the defect occurs, reworking is impossible which results in the whole module being defective, due to the reason that the semiconductor chip mounted via the COB method is molded by the EMC.

Furthermore, humid air from the external environment easily permeates into the interior of the package body, molded via the EMC, to cause failure such as disconnection of wires, thereby degrading reliability of the memory module.

SUMMARY OF THE INVENTION

The present invention is devised to solve the above-described problems. Therefore, it is an object of the present invention to provide a semiconductor memory module wherein a memory module is formed using defective semiconductor packages having a defect in a data line, thereby reducing manufacturing cost.

It is another object of the present invention to provide a semiconductor memory module capable of utilizing defective chips having pads on the peripheral portions of semiconductor chips as well as utilizing center-pad chips.

It is a further another object of the present invention to provide a semiconductor memory module capable of improving yield by a simple connection process of data lines and easy reworking using defective semiconductor chips.

It is still another object of the present invention to provide a semiconductor memory module capable of improving reliability by blocking humid air from permeating into the interior of the molding resin thereby preventing defects such as disconnection of wires.

To achieve the above objects of the present invention, a semiconductor memory module having a plurality of semiconductor packages mounted to a module substrate includes wiring patterns formed on the module substrate, contact pads electrically connected to the wiring patterns to mount leads of capacitors functioning to prevent electrical shock during on and off the semiconductor packages. Also, auxiliary pads are formed in two rows on one side of the mounting areas of the semiconductor packages while forming a right angle from the contact pads, and the module substrate having external I/O pins is provided for electrically connecting end portions of the wiring patterns, respectively. Here, the semiconductor packages having external leads mounted to be bonded on the contact pads of the module substrate further has at least one defect data I/O line, and the memory capacity of the overall memory module is maintained by coupling units selectively connecting only the normal data lines of the auxiliary pads, other than the defect data line, of the semiconductor package.

To achieve another object of the present invention, a semiconductor memory module having a plurality of semiconductor packages mounted to a module substrate includes wiring patterns formed on the module substrate, contact pads electrically connected to the wiring patterns for mounting leads of capacitors functioning to prevent electrical shock during on and off operation of the semiconductor packages, and auxiliary pads provided in two rows on one side of the mounting areas of the semiconductor packages while forming a right angle from the contact pads. Here, the module substrate having external I/O pins is provided for electrically connecting end portions of the wiring patterns, respectively, and the semiconductor packages having external leads mounted to be bonded on the contact pads of the module substrate further has at least one data I/O line being defective, and the memory capacity of the memory module is maintained. Moreover, jumper cable couplers are respectively formed of an external jumper and a female jumper for selectively connecting only the normal data lines of the auxiliary pads other than the defect data line of the semiconductor package.

Preferably, to achieve another object of the present invention, a semiconductor memory module includes semiconductor chips respectively having the same memory capacity and at least one defect data line being arranged to be fixed on a module substrate, wherein the semiconductor chips respectively have output pins connected to three data lines, and input pins connected to an input line of a column address strobe signal to be a refresh signal of a column address for operating the semiconductor chip, an input line of a row address strobe signal to be a refresh signal of a row address, and and commonly-connected input lines of a write signal and an address signal, whereby the semiconductor memory module is grounded by respective ground pins of the semiconductor chips.

BRIEF DESCRIPTION OF THE DRAWINGS

The above objects and other advantages of the present invention will become more apparent by describing, in detail, preferred embodiments of the invention with reference to the attached drawings in which.

DETAILED DESCRIPTION OF THE PREFERRED EMBODIMENTS

Figure 4A:
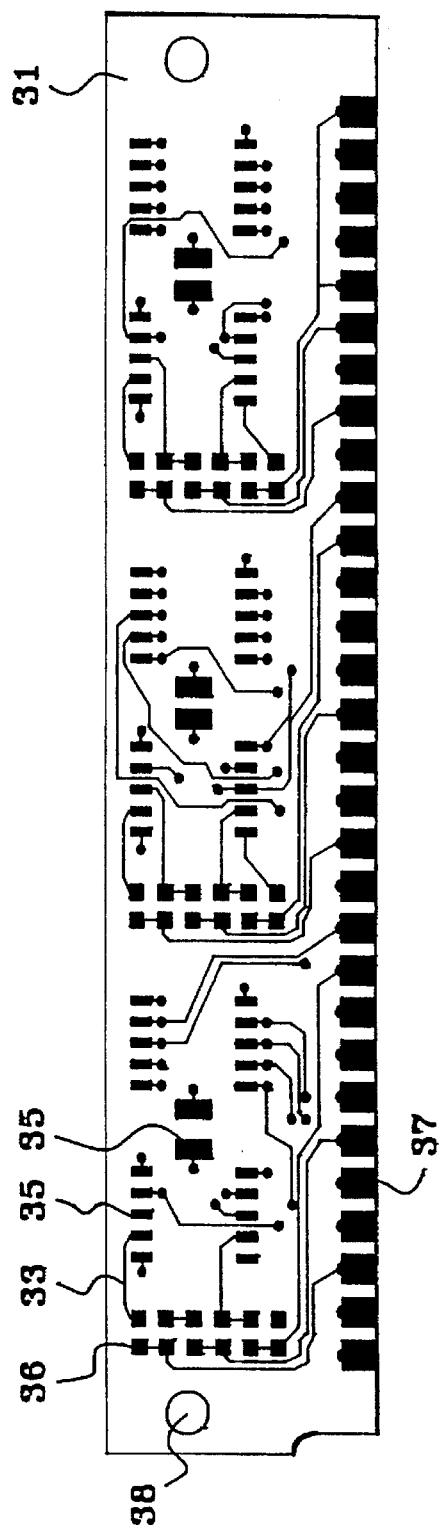
FIGS. 4A and 4B are a plan view and a bottom side view showing a module substrate of a semiconductor memory module device according to the present invention.
Figure 4B:
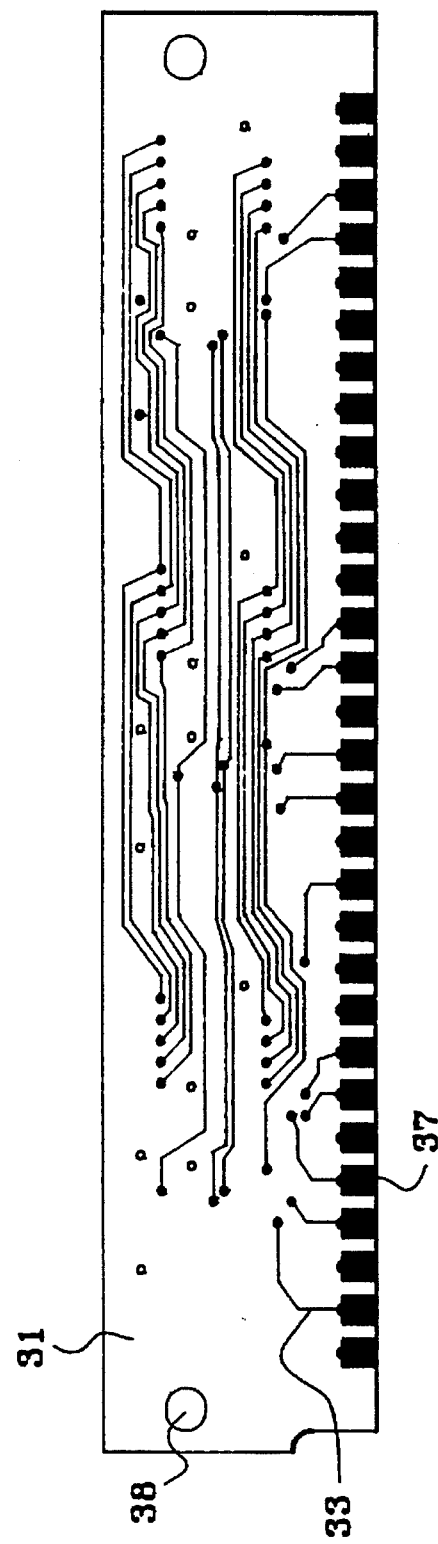

FIGS. 4A and 4B illustrate one embodiment of module substrate 31 used in forming a 1Mbx9 memory module by three semiconductor packages.

As shown in FIGS. 4A and 4B, wiring patterns 33 of a predetermined shape are provided on the plane surface of rectangular module substrate 31, formed of a plastic, and contact pads 35 connected to wiring patterns 33 are formed on portions of module substrate 31 contacting external leads of semiconductor packages (not shown).

Here, the semiconductor packages respectively involve at least one DDL, in which the semiconductor chip itself is defective or the semiconductor package is defective owing to disconnection of wires, etc. It should be noted that the number of data lines serving as the data I/O lines in normal operation of the semiconductor packages is more than nine.

I/O pins 37 connected to wiring patterns 33 for external connection are formed on one side of module substrate 31, and pads 35 formed on the centers of mounting areas of the semiconductor package on module substrate 31 are contact pads attached with capacitors for preventing electrical shock of the semiconductor chips. In addition, six auxiliary pads 36 of two rows are formed in three groups on portions except the mounting areas of the semiconductor packages, and the two rows of the auxiliary pads 36 can be shorted to each other.

The auxiliary pads 36 are formed to be arbitrarily connected by disconnecting only a wiring pattern 33 among the wiring patterns 33 connected to the defect data line, and connected by coupling units (not shown), e.g., resistors or jumper cable couplers, by proper combination in accordance with the occurring position of the DDL in the semiconductor package (not shown).

As shown in FIG. 4B, wiring patterns 33 electrically connected to contact pads 35 top to bottom and I/O pins 37 are provided on the bottom surface of the module substrate 31.

Although auxiliary pads 36 and wiring patterns 33 connected thereto are formed on the plane surface of module substrate 31, wiring patterns 33 connected to the auxiliary pads 36 may be formed on the bottom surface of module substrate 31, for convenience.

Through holes 38 are formed in both ends of module substrate 31 for transferring module substrate 31.

Figure 1:
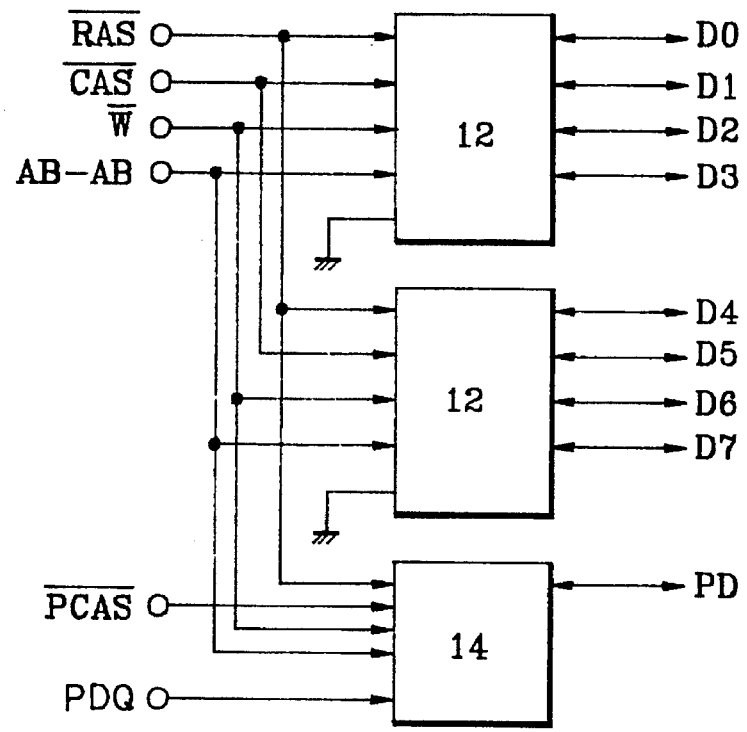
FIG. 1 is a block diagram showing the circuit function of a general 1Mbx9 semiconductor device.
Figure 3:
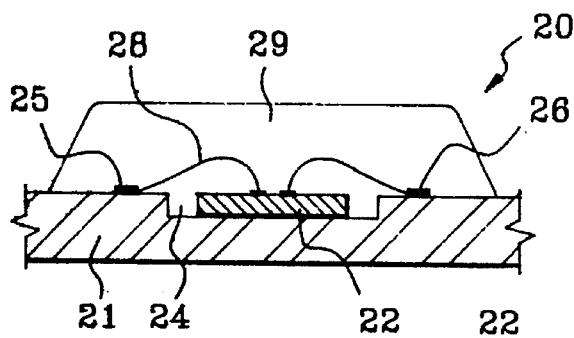
FIG. 3 is a sectional view showing the semiconductor device, taken along line III—III of FIG. 2.
Figure 6:
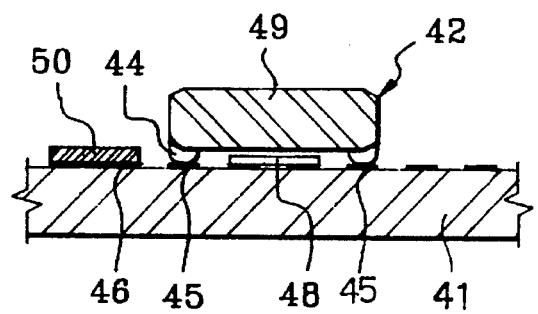
FIG. 6 is a sectional view showing a semiconductor device viewed along line VI—VI of FIG. 5.
Figure 2:
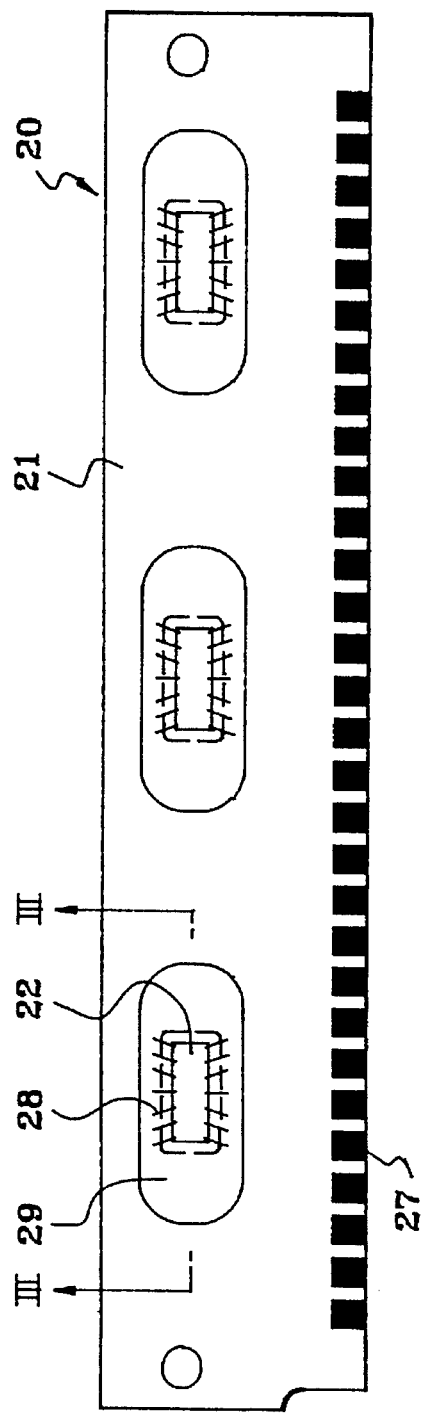
FIG. 2 is a plan view showing one example of a semiconductor memory module device for mounting the semiconductor device of FIG. 1.
Figure 5:
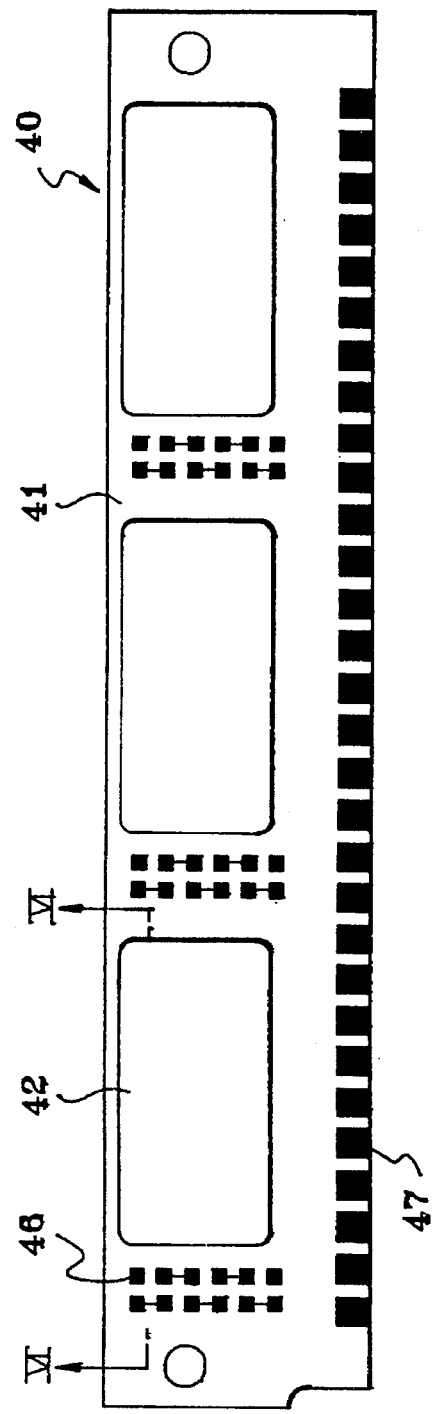
FIG. 5 is a plan view of one embodiment of the semiconductor memory module device showing a semiconductor device mounted to the module substrate of FIG. 4A.

FIG. 5 is a plan view of one embodiment of the semiconductor memory module showing semiconductor packages 42 mounted to the module substrate of FIG. 4A, and FIG. 6 is a sectional view showing semiconductor package 42 viewed along line VI—VI of FIG. 5.

As shown in FIG. 6, semiconductor packages 42 mounted with 4Mb semiconductor chips are loaded on contact pads 45 of module substrate 41, and bonded by solder.

Semiconductor packages 42 include at least one DDL, and the memory module is formed from a combination of semiconductor packages having more than nine available data lines. Respective semiconductor packages 42 are of the small out-line J-bend package (SOJ) type in which external leads 44 are inwardly curved from a package body 49 like a character "J".

On contact pads 45 formed on the lower portion of semiconductor packages 42 and in the space of the upper portion of module substrate 41, capacitors 48, for preventing electrical shock during on/off operation of semiconductor packages 42, are adhered by the solder.

Auxiliary pads 46 for determining memory capacity by selectively connecting the DDL are formed on the left and right sides of module substrate 41 except the mounting areas of semiconductor packages 42, and a coupling unit by a resistor is mounted to the auxiliary pad 46.

Therefore, as shown in FIG. 5, semiconductor packages 42 are mounted to the contact pads (not shown), and auxiliary pads 46 are provided on one side of semiconductor packages 42 to be electrically connected to I/O pins 47 by wiring patterns (not shown) on module substrate 41 of semiconductor memory module 40.

Figure 7:
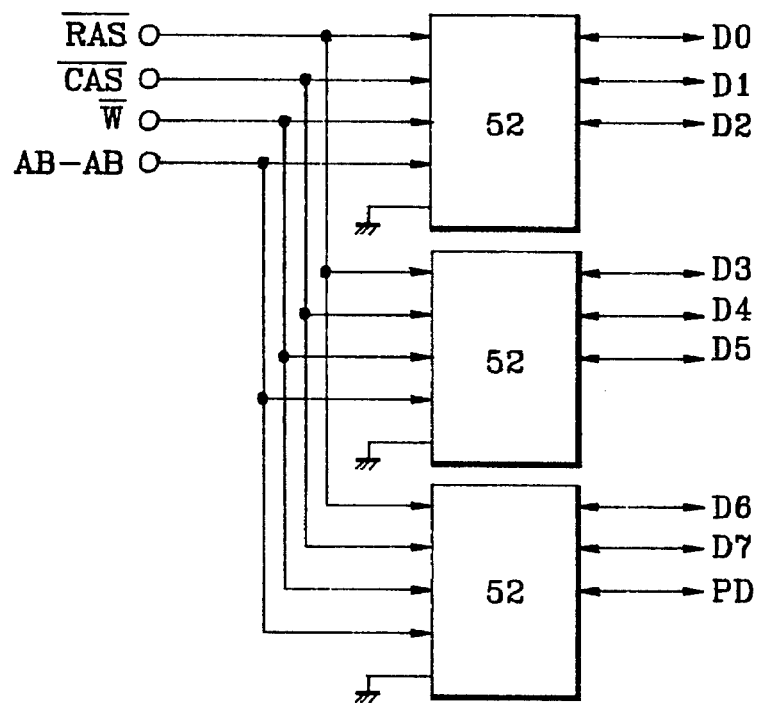
FIG. 7 is a block diagram showing the circuit function of the 4Mbx9 semiconductor device according to the present invention.

FIG. 7 is a block diagram showing the circuit function of the 4Mbx9 semiconductor device according to the present invention.

In the semiconductor device shown in FIG. 7, input lines of signals /RAS, /CAS, /W and address AB—AB are connected to the signal input pins of three 4Mb semiconductor chips 52, respectively, having one DDL. The data output pins of semiconductor chips 52 are connected to I/O lines D0–D7 and one ECC signal line PD. At this time, since the period of a signal /PCAS is the same as the signal /CAS, the same signal line is used.

Figure 8:
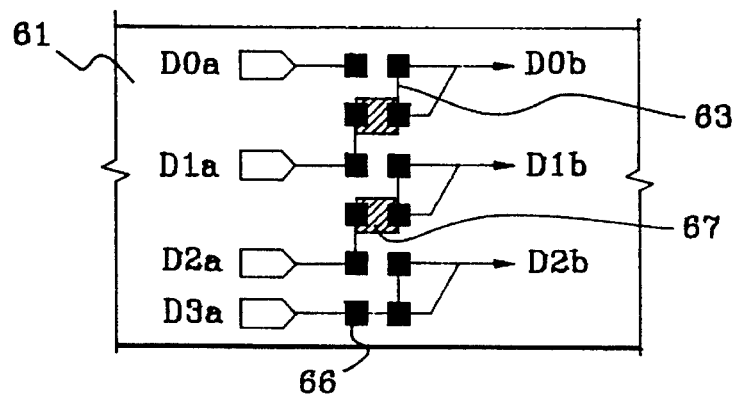
FIG. 8 is an enlarged plan view showing a principle part of the semiconductor memory module for connecting a data line to an auxiliary pad for the semiconductor device shown in FIG. 7.

FIG. 8 is an enlarged plan view showing a principle part of the semiconductor memory module for connecting a data line to an auxiliary pad for the semiconductor device shown in FIG. 7.

As shown in FIG. 8, six pairs of auxiliary pads 66 are formed in left and right rows on module substrate 61, and alternately connected by wiring patterns 63.

Auxiliary pads 66 in the left row are connected to four data lines D0a–D3a of a semiconductor chip (not shown), and those in the right row are connected such that two auxiliary pads are connected to one data line from among data lines D0b–D2b.

Because first data line D1a of semiconductor package 52 is a DDL, auxiliary pads 66 in the left and right rows are connected by coupling units, e.g., resistors 67. Thus, excluding data line D0a, and allowing data lines D1a, D2a and D3a to be electrically connected to data lines D0b, D1b and D2b.

Figure 9:
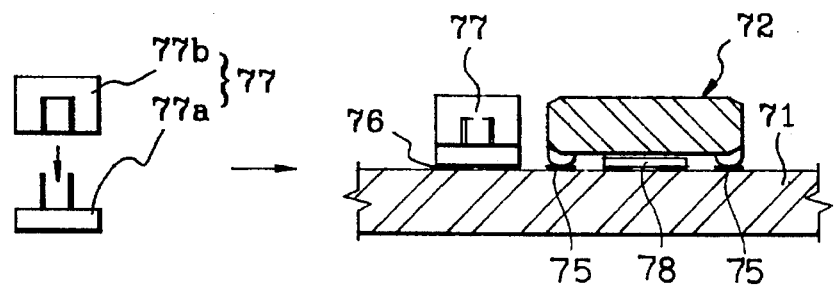
FIG. 9 is a sectional view showing another embodiment of the semiconductor device mounted to the semiconductor memory module according to the present invention.

FIG. 9 is a sectional view showing another embodiment of the semiconductor device mounted to the semiconductor memory module according to the present invention.

FIG. 9 shows a partial view of module substrate 71 for explaining another embodiment of the auxiliary pad connection method of the semiconductor memory module wherein jumper cable couplers 77, easily attached and detached, are employed in place of the coupling unit of FIG. 8, i.e. resistors 67.

As shown in FIG. 9, semiconductor packages 72 respectively having a DDL are mounted to contact pads 75 formed on module substrate 71 and are bonded by solder, and jumper cable couplers 77 are loaded on auxiliary pads 76 formed on predetermined portions on module substrate 71 other than the mounting areas of the semiconductor packages.

Jumper cable coupler 77 is bonded to auxiliary pad 76 on both left and right sides, and consists of an external jumper 77a having upwardly projecting pins 77a and female jumper 77b with a hole for receiving external jumper 77a for electrically connecting auxiliary pad 76 on the left and right sides.

As coupling units, resistors 67 and jumper cable couplers 77 may be installed directly by a manufacturer, or an automatic machine may be used to install or separate them during the manufacture of the memory module.

In the semiconductor memory module according to the present invention, the semiconductor packages respectively having at least one DDL are combined to obtain a memory capacity higher than the required memory capacity. Here, the module substrate is provided with two rows of auxiliary pads to exclude the defect data lines of the mounted semiconductor packages from overall data lines of the module.

Then the auxiliary pads are connected by coupling units, e.g., resistors or jumper cable couplers, to isolate the defective data line, so that the semiconductor memory module having the required memory capacity can be embodied.

Therefore, manufacturing cost can be reduced by utilizing defective semiconductor packages, all kinds of semiconductor packages can be employed to attain excellent compatibility, and the data line connection process is simple. Furthermore, reworking with respect to the defective semiconductor package is easy to improve yield, and humid air is prevented from permeating into the interior of the molding resin to prevent failures such as disconnection of wires, thereby improving reliability.

As a result, since the semiconductor memory module according to the present invention can separately isolate a defect data line of a semiconductor package by auxiliary pads formed on a module substrate, it will be understood by those skilled in the art that various changes in form and details may be effected therein without departing from the spirit and scope of the invention as defined by the appended claims.

What is claimed is:

1. A semiconductor memory module for mounting a plurality of semiconductor packages at respective mounting areas on a module substrate comprising:

wiring patterns formed on said module substrate;

contact pads electrically connected to said wiring patterns for mounting leads of capacitors functioning to prevent electrical shock during on and off operation of said semiconductor packages;

auxiliary pads provided on said module substrate on one side of said mounting areas of said semiconductor packages;

a plurality of external I/O pins mounted on said module substrate for electrically connecting end portions of respective of said wiring patterns;

semiconductor packages having external leads mounted to be bonded on said contact pads of said module substrate, at least one data I/O line being defective;

said memory module having a memory capacity; and coupling means for selectively connecting normal data lines of said module only to those of said auxiliary pads other than any corresponding to any said defective data I/O line of a said semiconductor package.

2. A semiconductor memory module as claimed in claim 1, wherein said auxiliary pads are provided in two rows, each forming a right angle to said contact pads.

3. A semiconductor memory module as claimed in claim 1, wherein said coupling means are resistors soldered between said auxiliary pads.

4. A semiconductor memory module as claimed in claim 1, wherein said coupling means are jumper cable couplers each composing an external pin-type jumper and a socket-type jumper which are cooperable for electrically connecting respective of said auxiliary pads.

5. A semiconductor memory as claimed in claim 4, wherein said auxiliary pads are provided in two rows, each forming a right angle from said contact pads.

\* \* \* \* \*